United States Patent
Chen et al.

[11] Patent Number: 5,972,728
[45] Date of Patent: Oct. 26, 1999

[54] ION IMPLANTATION FEEDBACK MONITOR USING REVERSE PROCESS SIMULATION TOOL

[75] Inventors: Ming Chun Chen, Milpitas; Paul J. Steffan, Elk Grove, both of Calif.

[73] Assignee: Advanced Micro Devices, Inc., Sunnyvale, Calif.

[21] Appl. No.: 08/986,315

[22] Filed: Dec. 5, 1997

[51] Int. Cl.$^6$ .................................................. H01L 21/66
[52] U.S. Cl. ........................... 438/18; 438/514; 438/530
[58] Field of Search ................................. 438/10, 11, 17, 438/18, 514, 530

[56] References Cited

U.S. PATENT DOCUMENTS

| | | | |
|---|---|---|---|
| 4,978,627 | 12/1990 | Liu et al. | 438/17 |
| 5,403,753 | 4/1995 | Huber et al. | 438/514 |
| 5,451,529 | 9/1995 | Hsu et al. | 438/18 |
| 5,650,336 | 7/1997 | Eriguchi et al. | 438/17 |

Primary Examiner—Chandra Chaudhari
Attorney, Agent, or Firm—H. Donald Nelson

[57] ABSTRACT

A method of obtaining accurate actual ion implantation equipment used in ion implantation processes during the manufacture of semiconductor devices. A monitor structure for each ion implant process is implanted with ions during the ion implant process. A control monitor structure is implanted with boron ions. The concentration profiles of all implanted monitor structure are determined during wafer electrical tests (WET). The as-implanted concentration profile is determined for the boron-implanted control monitor structure and the thermal budget of the manufacturing process is determined. The as-implanted concentration profiles of the remaining monitor structures are determined using the thermal budget determined from the boron-implanted control monitor structure. The actual operating parameters of the ion implantation equipment is determined from the as-implanted concentration profiles.

4 Claims, 3 Drawing Sheets

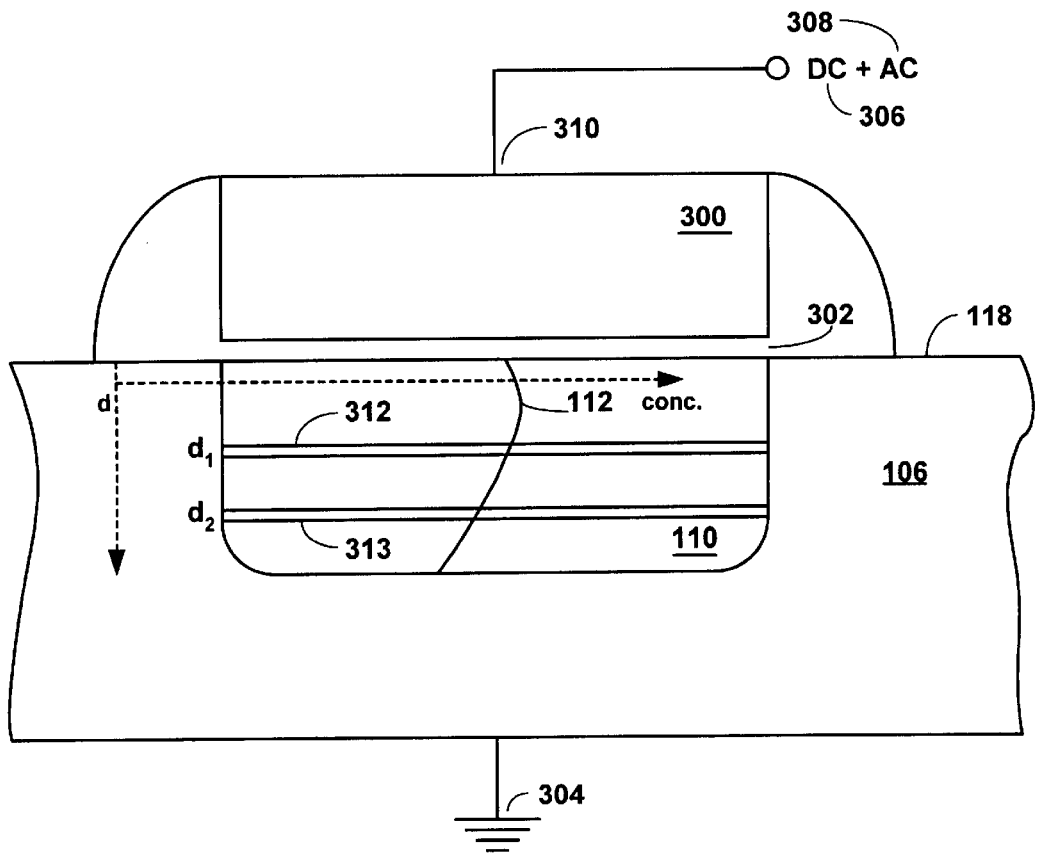
FIGURE 3A
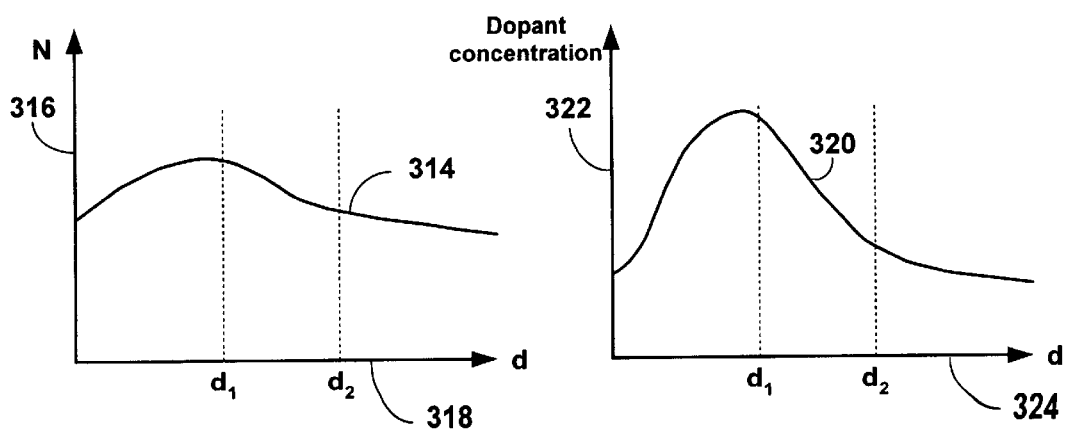
FIGURE 3B
FIGURE 3C

ION IMPLANTATION FEEDBACK MONITOR USING REVERSE PROCESS SIMULATION TOOL

BACKGROUND OF THE INVENTION

1. Field of the Invention

This invention relates generally to ion implantation processes in the manufacture of semiconductor integrated circuits. More particularly, this invention relates to a method of controlling the dose and energy of the ion implantation in the manufacturing process. Even more particularly, this invention relates to a method to precisely determine the dose and energy of a particular ion implant in the manufacturing process.

2. Discussion of the Related Art

In the typical semiconductor manufacturing facility, many simulation and analysis tools have been implemented to assist the process integration and device development efforts. These simulation and analysis tools, however, are typically employed to provide an indication of general trends. The latent potential of reducing the number of silicon runs and speeding up the process optimization cycle has not been fully achieved. One of the primary reasons the process optimization cycle has not been achieved is that the accuracy of the data obtained cannot be established to the degree necessary to determine the dependability of the simulations systems. The accuracy of the data obtained can only be achieved by a complete and detailed engineering calibration of the simulation system. This calibration, however, demands extensive engineering resources and data from multiple silicon production runs which, in turn, is usually only available at the latter stages of the process development or early production cycles.

In addition, process optimization for a technology that has completed qualification and is ramping-up production could receive great benefit from the extensive embedded device physics contained in advanced complex simulation tools. Despite this extensive knowledge base, statistical data analyzing tools dominate, to the near exclusion of device simulation tools, as the tools employed in the decision making process in modern semiconductor manufacturing facilities. The main reasons for this are as follows:

1. The manufacturing data is fundamentally statistical. It is usually impossible to control, much less measure exact values for many process parameters. Moreover, if the simulation, or even the actual silicon itself, yields only a single data point without accompanying distribution information, that result is usually insufficient to justify any qualified decision.

2. Process monitoring and optimization is an ongoing and reiterative sequence of fine-tuning that is dependent upon barely measurable differences which are affected by statistical fluctuation in process and complicated interactions between various process parameters. Therefore, a truly useful tool that an engineer can trust must provide a high order of data accuracy.

3. Vast amounts of process variables, in-line measurements and electrical data are continually collected in the manufacturing facility (fab). Current existing simulation tools, however, cannot effectively utilize this data.

Problematically, statistical analysis alone, without integration of the existing knowledge of device physics and simulation skills, is neither flexible nor powerful enough to handle engineering changes in the process without sufficient accurate actual data from the silicon itself.

Current semiconductor processing for advanced semiconductor processing technologies use a multiplicity of ion implanted layers in the manufacture of the semiconductor integrated circuits. The typical ion implant process is to implant dopant ions into a layer of semiconductor material to adjust a parameter of the semiconductor device. For many of these layers, precise control of the dose (dopant ions/$cm^2$) and the implantation energy (KeV) is critical for proper operation of the semiconductor integrated circuit. Current methods of measuring does and energy are not accurate enough to observe differences in the dose or implantation energy that will "kill" (make the device fail) the device. The trend towards smaller and smaller devices and more and more circuits on a device have exacerbated this problem.

One approach to solve this problem would be to have an array of ion implant monitor structures incorporated directly on the wafer such that at each implant layer mask the structure that corresponds to that layer would be open and receive the implant, while all the other ion implant monitor structures in the array are covered. After the processing of the wafer is completed, these structures would be made into metal gate devices that can be CV (capacitance/voltage) measured for implant profile, dose and energy. The problems with this method include the variability of the process, thermal budget and background concentration. These problems render this method untenable or at least inaccurate.

Therefore, what is needed is an accurate method to provide precise measurements of intrinsic process parametrics so that an accurate dopant dose and energy implant level can be determined for each and all ion implantation process steps.

SUMMARY OF THE INVENTION

An ion implantation feedback monitor using reverse process simulation in accordance with the present invention solves the above and other problems associated with the current simulation systems. The above and other objects and advantages of the present invention are attained through a method that determines the precise dopant dose and implantation energy of a particular ion implant by using implant structures that can be measured during WET (wafer electrical test) operations. The measurements obtained during the WET operations are fed into a reverse process simulator that determines the dopant dose and implantation energy at which the ion implantation actually occurred (as opposed to what the machine operator set on the machine).

The present invention provides a control structure, such as a boron implanted structure, which is highly characterized, to give an indication of the intrinsic process parametrics as described by a thermal budget value. The thermal budget value, which provides information concerning all thermal processes in the manufacturing process along with the CV data obtained from the other implanted structures are then input into a process simulation tool. The simulation tool then back-calculates for all implant layers the precise dopant dose and implantation energy for each of the implant layers.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention.

Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 3A illustrates how a CV (capacitance/voltage) test is conducted on the portion of the semiconductor device shown in FIGS. 1 & 2;

FIG. 3B is a graphical representation of the average concentration determined by the CV test as conducted as shown in FIG. 3A;

FIG. 3C is a graphical representation of the doping profile obtained by differentiating the curve as shown in FIG. 3B;

DETAILED DESCRIPTION

Figure 1:
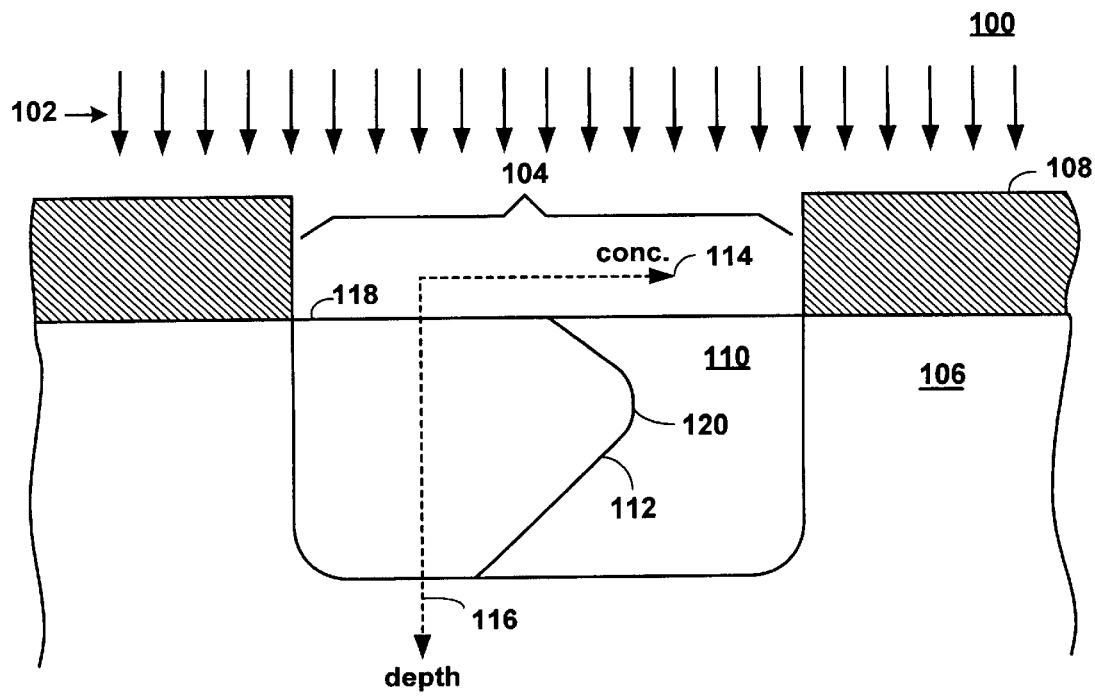
FIG. 1 illustrates an implantation of ions into a portion of a semiconductor device showing a representative doping profile of the implanted ions.

Reference is now made in detail to a specific embodiment of the present invention that illustrates the best mode presently contemplated by the inventors for practicing the invention. The figures are diagrammatic and, for clarity, not drawn to scale. Corresponding parts are generally referred to by the same reference numerals.

FIG. 1 illustrates an implantation of ions into a portion of a semiconductor device 100. The ions, represented by the arrows 102, are typically dopant ions such as boron, arsenic or phosphorus. Other ions that may be implanted are oxygen ions to form a buried oxide layer (BOX) in a portion of a semiconductor device. It should be understood that the following description of an implantation of ions is for illustrative purposes only and that other methods could be used to implant dopant and other types of ions. The ions, 102, are implanted into a selected region 104 of a layer of a semiconductor material 106. A protective material 108 is formed on the semiconductor material 106 that is not to be implanted with the ions. As is known in the semiconductor industry, the implanted ions 102 will form a region 110 in the semiconductor material 106 that has distinctly different properties than the surrounding material. These distinctly different properties need to be precisely controlled in order for the semiconductor device to function properly or to function in an optimal way. The curve 112 is the profile of the concentration of the ions 102 as implanted. The coordinates of the concentration profile are shown in dotted lines and show the concentration at 114 and the depth is shown at 116. The depth coordinate 116 corresponds to the depth below the surface 118 of the semiconductor material 106. As is known in the semiconductor manufacturing art, the concentration profile 112 has the shape as shown with a peak 120 at a distance below the surface 118. Although the ions 102 are accelerated by the same implantation energy, some of the electrons penetrate the semiconductor material more than others.

Figure 2:
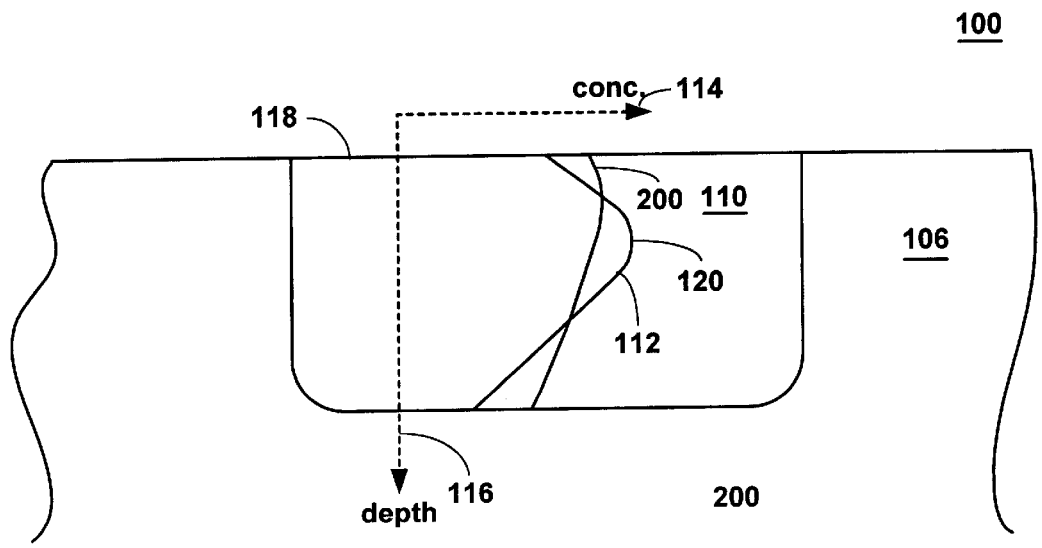
FIG. 2 illustrates the portion of the semiconductor device shown in FIG. 1 after subsequent thermal processes have been conducted and shows how the doping profile changes in response to the thermal processes.

FIG. 2 illustrates the portion of the semiconductor device 100 shown in FIG. 1 after subsequent thermal processes have been conducted. As is known in the semiconductor manufacturing art, the subsequent thermal processes drive the ions deeper into the semiconductor material 106. The original concentration profile 112 is repeated as a reference. The thermal processes cause the concentration profile to change and the change is dependent both upon the dopant material and the thermal budget (the temperatures and times the device is at the elevated temperatures). The concentration profile may assume the shape shown at 200.

FIG. 3A illustrates how a CV (capacitance/voltage) test is conducted on the portion of the semiconductor device 100. After the thermal processes have been completed and the semiconductor device 100 has been completed the semiconductor devices are subjected to a wafer electrical test (WET) procedure. The semiconductor device 100 has a gate region 300 formed over the ion implanted region 110. The gate region 300 is formed with a gate oxide region 302 separating the gate region 300 from the ion-implanted region 110. The semiconductor material 106 is grounded as shown at 304 and a DC bias voltage 306 with an AC voltage 308 superimposed on the DC bias voltage is applied to the gate region 110 as shown at 310. The DC bias voltage 306 is varied and the capacitance between the gate region 300 and the ion-implanted region 110 is measured at the different DC bias voltage levels. The average dopant concentration N at a depth d is determined from the relationships between the DC bias voltage 306, the measured capacitance and the depth d. The measured capacitance is proportional to the reciprocal of the average concentration N; C 1/N. The depth d is proportional to the square root of the DC bias 306; d √DC. The determination of the concentration profile is as follows. The capacitance at a first DC bias voltage 306 is measured and indicates the average concentration N of the band 312 at the depth $d_1$. The capacitance at a second DC bias voltage 306 is measured and indicates the average concentration N of the band 313 at the depth $d_2$. Other values of N are determined and all of these values are plotted to form the curve 314 in FIG. 3B. The vertical coordinate 316 represents the average concentration N and the horizontal coordinate 318 represents the depth d. To obtain the actual concentration, the curve 314 is differentiated and results in the curve 320 in FIG. 3C. The vertical coordinate 322 is the actual dopant concentration and the horizontal coordinate 324 represents the depth d.

Figure 4A:
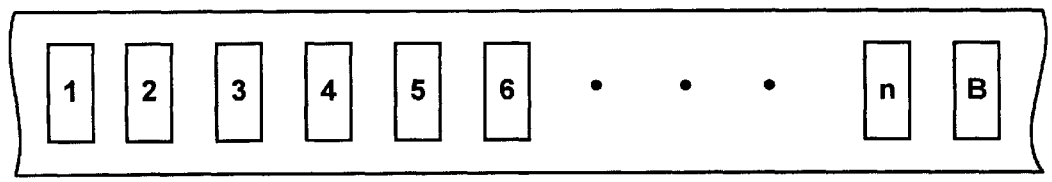
FIG. 4A shows an array of ion implant monitors with a boron control structure in accordance with the present invention.

FIG. 4A shows an array 400 of ion implant monitors 1 through n. The array 400 is formed in a non-used portion of the wafer such as in a scribe line. The ion implant monitor B is a control structure. The preferred control structure is a structure implanted with boron ions. The first ion implant monitor structure 1 is a non-implant area to provide a baseline value. The structures are used as follows. A structure is formed for every ion implant process utilized in the manufacture of the semiconductor device. For example, if there is a process in which an arsenic implant region is to be formed, a monitor structure is implanted at the same time and under the same conditions. The monitor structures 1–n and B are covered except when being implanted. A monitor structure is formed for every ion implantation process and at the same time and under the same conditions. This results in a monitor structure that has been subjected to the same thermal processes and other environmental parameters and conditions.

Figure 4B:
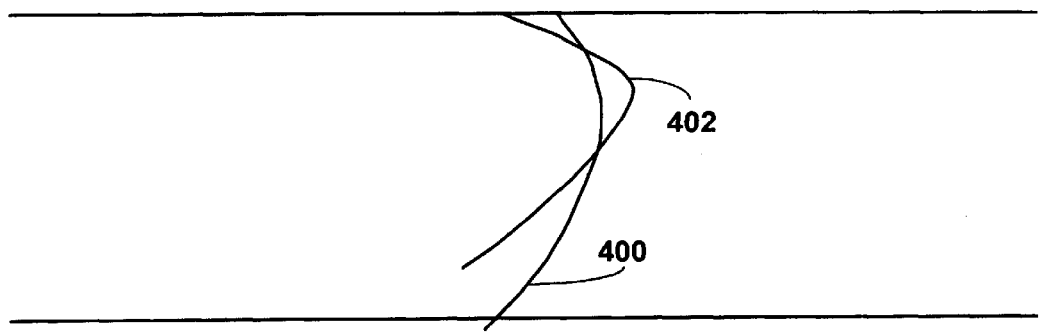
FIG. 4B shows the measured concentration profile of the boron control structure shown in FIG. 4A and the as implanted concentration profile of the boron control structure as determined from the measured concentration profile.
Figure 4C:
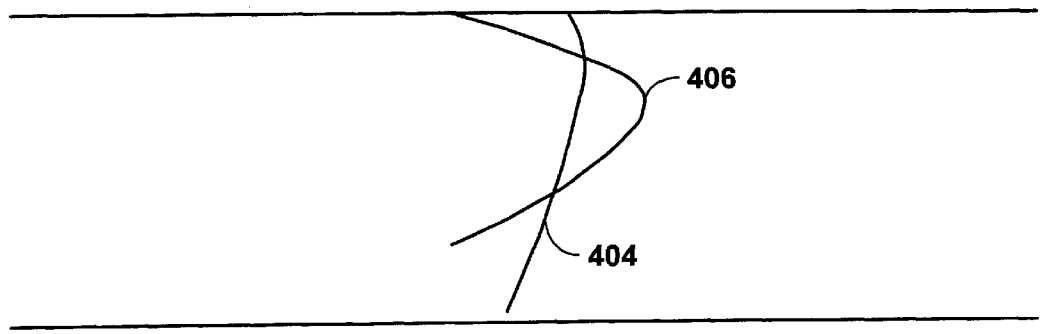
FIG. 4C shows a measured concentration profile of a second implant monitor structures shown in FIG. 4A and the as implanted concentration profile of the second implant as determined from the information determined from the boron control structure.

FIGS. 4B and 4C illustrate how the ion implant monitors are utilized to provide precise data concerning the actual dosage and implant energy for each implant. FIG. 4B shows the concentration profiles of the boron control monitor structure B (FIG. 4A). The boron concentration profile 400 is the concentration profile measured during wafer electrical testing that is conducted after the device has been completed. The measurements are made as described above in conjunction with FIGS. 3A–3C. Because boron profiles are very well known and characterized, the as-implanted profile 402 can be derived as well as a precise determination of the intrinsic process parametrics as described by a thermal budget value. FIG. 4C shows a typical set of concentration profiles of one of the monitor structures 1–n. The concentration profile 404 is measured after the device has been completed during wafer electrical testing as described above in conjunction with FIGS. 3A–3C. Because the precise thermal budget has been derived from the measured concentration of the boron control structure B, the actual as-implanted profile 406 can be derived for the implanted ions represented by the ion monitor structure. Knowing the as-implanted profile for the ions allows a determination of implant parameters such as actual implant energy and actual dopant concentration. This data provides a check on the actual operation parameters of the implantation equipment. This data can be used to calibrate the ion implantation equipment and to predict the actual operation of the equipment. As is known in the semiconductor manufacturing art, the operation of the equipment changes as the implant machine is operated. The walls of the implant machine can become coated with various implant materials and the parameters change.

The benefits of the present invention are as follows:

1. The method of the present invention will allow accurate monitoring of ion implant doses and energies for every wafer.

2. The method of the present invention provides a non-destructive approach for accurate results that can be used in failure analysis or root cause analysis.

3. The method of the present invention can be used as a source of process control data that can be provided to other simulation tools.

4. The method of the present invention can be used as a line or equipment-monitoring tool.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of obtaining accurate actual ion implantation equipment operating parameters, the method comprising:

provided a monitor structure for each ion implant process that occurs during manufacture of a semiconductor device;

implanting a control monitor structure with selected ions;

implanting ions into one of the monitor structures during each ion implant process;

determining a concentration profile of the control monitor structure during wafer electrical tests;

deriving a thermal budget from the measured concentration profile of the control monitor structure;

determining a concentration profile of each of the monitor structures for each ion implant process during wafer electrical tests;

determining an as-implanted concentration profile of each of the monitor structures using the derived thermal budget; and determining the actual operating parameters of the ion implantation equipment using the as-implanted concentration profile of each of the monitor structures.

2. The method of claim 1 wherein the control monitor structure is implanted with boron ions.

3. The method of claim 2 wherein one of the monitor structures is utilized as a baseline structure and not implanted with ions.

4. The method of claim 3 wherein the monitor structures are formed in a scribe line of a wafer.

* * * * *